United States Patent [19]

Milburn, Jr.

[11] 4,228,370

[45] Oct. 14, 1980

[54] BISTABLE MULTIVIBRATOR WITH TRIGGER STEERING

[75] Inventor: Zachariah H. Milburn, Jr., Amherst, N.Y.

[73] Assignee: GTE Products Corporation, Stamford, Conn.

[21] Appl. No.: 945,265

[22] Filed: Sep. 25, 1978

[51] Int. Cl.³ .................................................. H03K 3/286
[52] U.S. Cl. ..................................... 307/291; 307/237; 328/206; 328/196
[58] Field of Search ............... 307/215, 291, 292, 237, 307/289; 328/196, 206

[56] References Cited

U.S. PATENT DOCUMENTS

| | | | |
|---|---|---|---|
| 3,786,282 | 1/1974 | Orndorff | 307/291 |
| 3,916,225 | 10/1975 | Anzani | 307/291 |

*Primary Examiner*—John Zazworsky
*Attorney, Agent, or Firm*—John A. Odozynski

[57] ABSTRACT

A multivibrator constructed from cross-coupled, dual-input (NAND) gates. Each gate has a clamping network connected between its output and one input. The clamping circuit assures that the gate whose output is at a logic ZERO level changes output state in response to a trigger signal that is applied to trigger steering networks associated with both gates. As a result, the gate whose output is at a logic ONE level subsequently changes state thereby assuring predictable triggering and the desired bistable multivibrator action.

8 Claims, 1 Drawing Figure

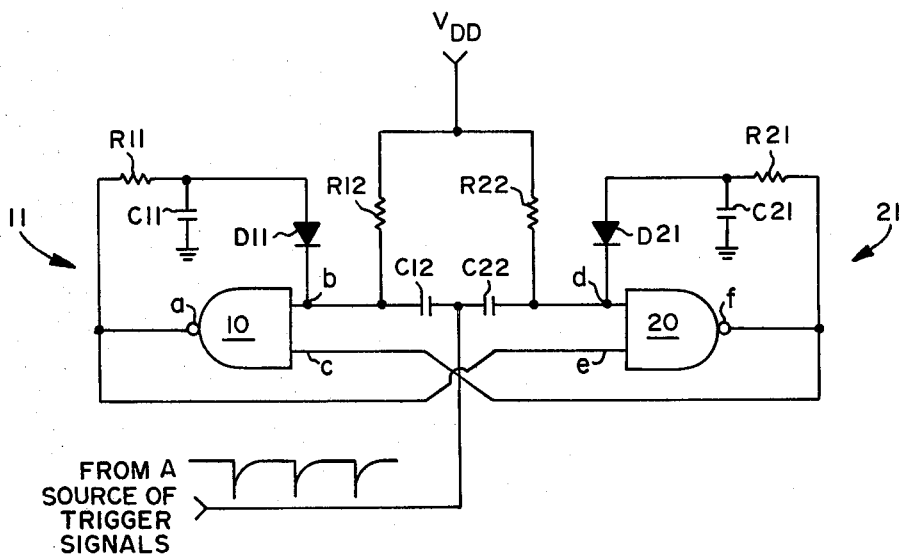

BISTABLE MULTIVIBRATOR WITH TRIGGER STEERING

FIELD OF THE INVENTION

This invention relates to logic circuitry in general and more particularly to a triggerable bistable multivibrator constructed from cross-coupled, dual-input NAND gates.

BACKGROUND OF THE INVENTION

In general, a triggerable bistable multivibrator is a logic device the output of which changes state, or is complemented, upon the application of, for example, a negative-going signal at its trigger input. It is well known that such a device can be constructed by cross-coupling the outputs of two dual-input NAND gates to one of their respective inputs. The other input of each gate is then coupled to a source of trigger signals. However, NAND gate logic results in an indeterminate output state when the negative-going trigger signal is applied and then removed. Under these conditions the multivibrator output condition is a function of whatever timing imbalance may be inherent in the otherwise symmetrical logic circuitry. In order to assure that the multivibrator will change state as desired upon the application of the trigger signal it has been necessary to appropriately condition the trigger inputs of the NAND gates.

OBJECTS OF THE INVENTION

It is an object of this invention to implement an improved multivibrator circuit, said circuit constructed from cross-coupled logic gates.

It is a further object of this invention to assure that the multivibrator change state in a predictable manner subsequent to the application of an appropriate signal at the multivibrator trigger input.

SUMMARY OF THE INVENTION

The above-noted and other objects and advantages are achieved in one aspect of this invention by a triggerable multivibrator comprising two multiple-input logic gates, each having a clamped and an unclamped input. The output of the first gate is connected to the unclamped input of the second gate and, analogously, the output of the second gate is connected to the unclamped input of the first gate. First and second clamping networks are respectively coupled between the output and clamped input of each gate.

BRIEF DESCRIPTION OF THE DRAWING

The sole drawing is a schematic diagram of the triggerable multivibrator.

DESCRIPTION OF THE PREFERRED EMBODIMENT

For a better understanding of the present invention, together with other and further objects, advantages and capabilities thereof, reference is made to the following disclosure and appended claims in connection with the above description of some of the aspects of the invention.

Referring now to the drawing, the triggerable multivibrator includes first and second dual-input NAND gates, 10 and 20 respectively. The output (a) of the gate 10 is connected to the unclamped input (e) of gate 20. Analogously, the output (f) gate 20 is coupled to the unclamped input (c) of gate 10. A first clamping network 11 is connected between the output and clamped input (b) of gate 10. A second clamping network 21, identical in structure to the first, is connected between the output and clamped input (d) of gate 20. Input (b) of gate 10 is coupled through first resistive steering means, resistor R12, to a source of potential, $V_{DD}$, and through first capacitive steering means, capacitor C12, to a source of trigger signals. R12 and C12 form the trigger steering network associated with gate 10. Analogously, input (d) of gate 20 is coupled through second resistive steering means, resistor R22, to $V_{DD}$, and through second capacitive steering means, capacitor C22, to the source of trigger signals. R22 and C22 form the trigger steering network associated with gate 20. The identical clamping networks 11 and 21 each include respective first and second resistive clamping means, resistors R11 and R21, connected at one end to the output of the associated NAND gate. The other ends of both R11 and R21 are connected to respective first and second capacitive clamping means, capacitors C11 and C21. C11 and C21 are both connected to ground. The respective junctions formed by the resistive and capacitive clamping means are coupled through diodes D11 and D21 to the clamped input of the associated NAND gate.

In a manner to be described, the clamping networks assure that only the gate whose output is at a logic ZERO level, approximately zero volts, will change its output state upon the application of a negative-going trigger pulse. This precludes a "warring" condition and assures the desired multivibrator action. Operation is as follows.

Assume that gate 10 has an output at a logic ONE level, approximately equal to $V_{DD}$ volts. Both inputs to gate 20 will be at a logic ONE levels, input (d) being coupled to $V_{DD}$ through R22, and the output of gate 20 will be at a logic ZERO level. The voltages across capacitors C11 and C21 will be charged to the output voltage of their associated NAND gates, that is, $V_{DD}$ and zero volts respectively. Upon application of the leading edge of a negative-going, say from $V_{DD}$ to zero volts, trigger signal at the junction of C12 and C22, input (d) of gate 20 will momentarily go from $V_{DD}$ volts to zero volts. However, because the voltage across C11 and the voltage on the anode of D11 is approximately $V_{DD}$ volts, the negative-going signal will not appear at input (b) of gate 10; it will be clamped at approximately $V_{DD}$ volts. This is because, as the clamped input of gate 10 goes below $V_{DD}$ volts, D11 will become forward biased and clamp the voltage at that point to approximately $V_{DD}$ volts. As a result, the output of gate 20 will substantially instantaneously go to a logic ONE level. (A logic ZERO level at any input of a multiple-input NAND gate results in a logic ONE level at its output.) As the output of gate 20 goes to a logic ONE level, both inputs to gate 10 will be at ONE and its output will now change state, that is, go from ONE to ZERO, thereby assuring that the output of gate 20 remains at a logic ONE level. During the interval between succeeding negative-going trigger pulses, gate 20 will charge C21 through R21 to approximately $V_{DD}$ volts; gate 10 will discharge C11 through R11 to zero volts. Upon the next application of a trigger pulse, the situation will be reversed: the clamped input (d) of gate 20 will be clamped at $V_{DD}$ volts but the voltage at the clamped input (b) of gate 10 will go from $V_{DD}$ volts to zero volts. The output of gate 10 will go from ZERO to ONE and, subsequently, the output of gate 20 will go from ONE to ZERO.

Accordingly, the triggerable multivibrator described above circumvents the indeterminate output state generally inherent in multivibrators constructed from cross-coupled NAND gates. Furthermore, it is well known to those skilled in the art that bistable multivibrators can also be constructed from other logic elements, for example, dual-input NOR gates, and that these alternate constructions are generally likewise susceptible to output state indeterminacy when operating in a triggerable mode. It is obvious that the circuitry described herein will have applicability in conjunction with multivibrators constructed from other logic blocks or, for that matter, with multivibrators constructed in discrete form.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. A triggerable multivibrator comprising:
   first and second multiple-input logic gates, each having a clamped input and an unclamped input wherein the output of the first logic gate is connected to the unclamped input of the second logic gate and the output of the second logic gate is connected to the unclamped input of the first logic gate,
   a first clamping network connected between the output and the clamped input of the first logic gate, and
   a second clamping network connected between the output and the clamped input of the second logic gate.

2. A triggerable multivibrator as defined in claim 1 further comprising:
   first and second resistive steering means coupled between a potential voltage and the clamped inputs of the first and second logic gates respectively, and
   first and second capacitive steering means coupled between a source of trigger signals and the clamped inputs of the first and second logic gates respectively.

3. A triggerable multivibrator as defined in either claim 1 or claim 2 wherein the first and second clamping networks are of substantially identical structure, each comprising:
   resistive clamping means connected at one end to the output of the respective logic gate;
   capacitive clamping means connected between the other end of the resistive clamping means and a reference potential; and
   a clamping diode connected between the clamped input of the associated logic gate and the junction formed by the resistive clamping means and the capacitive clamping means.

4. A triggerable multivibrator as defined in either claim 1 or claim 2 wherein the logic gates are NAND gates characterized by an output voltage that is a logic ONE level whenever the voltage at any associated input is at a logic ZERO level.

5. A triggerable multivibrator as defined in claim 3 wherein the logic gates are NAND gates characterized by an output voltage that is a logic ONE level whenever the voltage at any associated input is at a logic ZERO level.

6. A triggerable bistable multivibrator comprising:
   first and second dual-input NAND gates, each having a clamped input and an unclamped input wherein the output of the first NAND gate is connected to the unclamped input of the second NAND gate and the output of the second NAND gate is connected to the unclamped input of the first NAND gate;
   a pair of clamping networks each coupled between the output and clamped input of the associated NAND gate, said clamping networks individually comprising:
   resistive clamping means connected at one end to the output of the associated NAND gate;
   capacitive clamping means connected between the other end of the resistive clamping means and a reference potential, and
   a clamping diode having a cathode connected to the clamped input of the associated NAND gate and an anode connected to the junction of the associated resistive and capacitive clamping means; and
   a pair of trigger steering networks, each connected between the output of a source of trigger signals and the clamped input of the associated NAND gate, said steering networks individually comprising:
   resistive steering means coupled between a potential voltage and the clamped input of the associated NAND gate, and
   capacitive steering means coupled between a source of trigger signals and the clamped input of the associated NAND gate.

7. In a triggerable multivibrator constructed from a first and a second multiple-input, cross-coupled logic gate, the improvement comprising first and second clamping networks, said first clamping network coupled between a first input of the first logic gate and the output of that gate and said second clamping network coupled between a first input of the second logic gate and the output of that gate.

8. An improvement as defined in claim 7 wherein the clamping networks comprise:
   resistive clamping means connected at one end to the output of the respective logic gate;
   capacitive clamping means connected between the other end of the resistive clamping means and a reference potential, and
   a clamping diode connected between the first input of the respective logic gate and the junction formed by the resistive clamping means and capacitive clamping means.

* * * * *